US011462402B2

(12) United States Patent
Vogt et al.

(10) Patent No.: US 11,462,402 B2
(45) Date of Patent: Oct. 4, 2022

(54) SUBOXIDE MOLECULAR-BEAM EPITAXY AND RELATED STRUCTURES

(71) Applicants: Cornell University, Ithaca, NY (US); The Penn State Research Foundation, University Park, PA (US)

(72) Inventors: Patrick Vogt, Ithaca, NY (US); Darrell G. Schlom, Ithaca, NY (US); Felix V. E. Hensling, Ithaca, NY (US); Kathy Azizie, Plainfield, NJ (US); Zi-Kui Liu, State College, PA (US); Brandon J. Bocklund, State College, PA (US); Shun-Li Shang, State College, PA (US)

(73) Assignees: Cornell University, Ithaca, NY (US); The Penn State Research Foundation, University Park (PA)

( * ) Notice: Subject to any disclaimer, the term of this patent is extended or adjusted under 35 U.S.C. 154(b) by 3 days.

(21) Appl. No.: 17/076,011

(22) Filed: Oct. 21, 2020

(65) Prior Publication Data

US 2022/0122843 A1 Apr. 21, 2022

(51) Int. Cl.
*H01L 21/02* (2006.01)
*C30B 29/16* (2006.01)
(Continued)

(52) U.S. Cl.
CPC ...... *H01L 21/02631* (2013.01); *C30B 23/066* (2013.01); *C30B 29/16* (2013.01); *H01L 21/02565* (2013.01); *H01L 29/24* (2013.01)

(58) Field of Classification Search
CPC ......... H01L 21/02565; H01L 21/02414; H01L 21/02433; C30B 29/16
See application file for complete search history.

(56) References Cited

U.S. PATENT DOCUMENTS 6,030,453 A 2/2000 Passlack et al.
6,094,295 A 7/2000 Passlack et al.
(Continued)

OTHER PUBLICATIONS

Adkison et al., "Suitability of binary oxides for molecular-beam epitaxy source materials: A comprehensive thermodynamic analysis," APL Materials, vol. 8, No. 8, Aug. 24, 2020, pp. 081110-1-081110-18.

(Continued)

*Primary Examiner* — Jaehwan Oh
(74) *Attorney, Agent, or Firm* — Withrow & Terranova, P.L.L.C.

(57) ABSTRACT

Molecular-beam epitaxy (MBE) and more particularly suboxide MBE (S-MBE) and related structures are disclosed. S-MBE is disclosed that includes the use of a molecular beam of a suboxide that may be subsequently oxidized in a single step reaction to form an oxide film. By way of example, for a gallium oxide ($Ga_2O_3$) film, a molecular beam including a suboxide of gallium ($Ga_2O$) may be provided. S-MBE may be performed in adsorption-controlled regimes where there is an excess of source material containing species in order to promote high growth rates for oxide films with improved crystallinity. Source mixtures for providing molecular beams of suboxides are disclosed that include mixtures of a particular element and an oxide of the element in ratios that promote such adsorption-controlled growth regimes. Related structures include oxide films having increased thickness with reduced crystal defects, including single polymorph films of gallium oxide.

20 Claims, 7 Drawing Sheets

32
36
36a
46
46t
40
44

(51) Int. Cl.
*C30B 23/06* (2006.01)
*H01L 29/24* (2006.01)

(56) References Cited

U.S. PATENT DOCUMENTS

| | | | | |
|---|---|---|---|---|
| 6,159,834 | A | 12/2000 | Yu et al. | |
| 10,861,945 | B2 * | 12/2020 | Sasaki | H01L 21/02433 |
| 11,152,225 | B1 * | 10/2021 | Hara | H01L 21/477 |
| 2014/0008767 | A1 * | 1/2014 | Li | H01L 21/0243 257/618 |
| 2016/0149005 | A1 * | 5/2016 | Oda | C01G 15/006 117/88 |
| 2017/0278933 | A1 * | 9/2017 | Sasaki | H01L 29/105 |
| 2019/0148244 | A1 * | 5/2019 | Ching | H01L 21/823814 257/190 |
| 2019/0242839 | A1 * | 8/2019 | Horng | G01N 27/04 |
| 2019/0352798 | A1 * | 11/2019 | Xia | C30B 33/02 |
| 2019/0371894 | A1 * | 12/2019 | Maekawa | H01L 29/1608 |
| 2020/0227251 | A1 * | 7/2020 | Odnoblyudov | C30B 29/06 |
| 2020/0234945 | A1 * | 7/2020 | Odnoblyudov | H01L 33/20 |
| 2020/0308725 | A1 * | 10/2020 | Ichikawa | C30B 23/02 |
| 2021/0269941 | A1 * | 9/2021 | Hoshikawa | C30B 11/002 |

OTHER PUBLICATIONS

Ahmadi et al., "Ge doping of β-Ga2O3 films grown by plasma-assisted molecular beam epitaxy," Applied Physics Express, vol. 10, No. 4, Mar. 9, 2017, pp. 041102-1-041102-4.

Ahman et al., "A Reinvestigation of β-Gallium Oxide," Acta Crystallographica Section C, Jun. 1996, pp. 1336-1338.

Alcock et al., "Vapor Pressure of the Metallic Elements," Canadian Metallurgical Quarterly, vol. 23, No. 3, 1984, pp. 309-313.

Bierwagen et al., "Plasma-assisted molecular beam epitaxy of high quality In2O3(001) thin films on Y-stabilized ZrO2(001) using In as an auto surfactant," Applied Physics Letters, vol. 95, No. 26, Dec. 29, 2009, pp. 262105-1-262105-3.

Calleja et al., "Growth of III-nitrides on Si(1 1 1) by molecular beam epitaxy Doping, optical, and electrical properties," Journal of Crystal Growth, vol. 201-202, May 1999, pp. 296-317.

Fernández-Garrido et al., "In situ GaN decomposition analysis by quadrupole mass spectrometry and reflection high-energy electron diffraction," Journal of Applied Physics, vol. 104, No. 3, Aug. 14, 2008, pp. 033541-1-033541-6.

Frosch et al., "The Pressure of Ga2O Over Gallium-Ga2O3 Mixtures," The Journal of Physical Chemistry, vol. 66, No. 5, May 1, 1962, pp. 877-878.

Gamal et al., "Some Physical Properties of Ga2Se Single Crystals," Crystal Research and Technology, vol. 31, No. 3, Jan. 1, 1996, pp. 359-364.

Ghose et al., "Growth and characterization of β-Ga2O3 thin films by molecular beam epitaxy for deep-UV photodetectors," Journal of Applied Physics, vol. 122, No. 9, Sep. 5, 2017, pp. 095302-1-095302-8.

Ghose et al., "Structural and optical properties of β-Ga2O3 thin films grown by plasma-assisted molecular beam epitaxy," Journal of Vacuum Science & Technology B, vol. 34, No. 2, Feb. 19, 2016, pp. 02L109-1-02L109-6.

Golding et al., "Molecular-beam-epitaxial growth and characterization of In2Te3," Journal of Applied Physics, vol. 65, No. 5, Mar. 1, 1989, pp. 1936-1941.

Greenberg et al., "Thermodynamic properties of In2Se," The Journal of Chemical Thermodynamics, vol. 5, No. 2, Mar. 1973, pp. 233-237.

Higashiwaki et al., "Gallium oxide (Ga2O3) metal-semiconductor field-effect transistors on single-crystal β-Ga2O3 (010) subsirales," Applied Physics Letters, vol. 100, No. 1, Jan. 4, 2012, pp. 013504-1-013504-3.

Hoffmann et al., "Efficient suboxide sources in oxide molecular beam epitaxy using mixed metal + oxide charges: The examples of SnO and Ga2O," APL Materials, vol. 8, No. 3, Mar. 12, 2020, pp. 031110-1-031110-10.

Kato et al., "Effect of O/Zn Flux Ratio on Crystalline Quality of ZnO Films Grown by Plasma-Assisted Molecular Beam Epitaxy," Japanese Journal of Applied Physics, vol. 42, No. 4S, Apr. 1, 2003, pp. 2241-2244.

Koblmuller et al., "Surface kinetics and thermal instability of N-face InN grown by plasma-assisted molecular beam epitaxy," Journal of Applied Physics, vol. 101, No. 8, Apr. 25, 2007, pp. 083516-1-083516-9.

Korhonen et al., "Electrical compensation by Ga vacancies in Ga2O3 thin films," Applied Physics Letters, vol. 106, No. 24, Jun. 17, 2005, pp. 242103-1-pp. 242103-3.

Kracht et al., "Tin-Assisted Synthesis of ϵ-Ga2O3 by Molecular Beam Epitaxy," Physical Review Applied, vol. 8, No. 5, Nov. 3, 2017, pp. 054002-1-054002-8.

Krishnamoorthy et al., "Modulation-doped 8-(Al0.2Ga0.8)2O3/Ga2O3 field-effect transistor," Applied Physics Letters, vol. 111, No. 2, Jul. 12, 2017, pp. 023502-1-023502-4.

Mei et al., "Adsorption-controlled growth and properties of epitaxial SnO films," Physical Review Materials, vol. 3, No. 10, Oct. 21, 2019, pp. 105202-1-105202-6.

Migita et al., "Self-limiting process for the bismuth content in molecular beam epitaxial growth of Bi2Sr2CuOy thin films," Applied Physics Letters, vol. 71, No. 25, Dec. 22, 1997, pp. 3712-3714.

Okamoto et al., "Growth and characterization of In2Se3 epitaxial films by molecular beam epitaxy," Journal of Crystal Growth, vol. 175-176, part 2, May 1, 1997, pp. 1045-1050.

Onuma et al., "Valence band ordering in β-Ga2O3 studied by polarized transmittance and reflectance spectroscopy," Japanese Journal of Applied Physics, vol. 54, No. 11, Oct. 14, 2015, pp. 112601-1-112601-5.

Paik et al., "Adsorption-controlled growth of La-doped BaSnO3 by molecular-beam epitaxy," APL Materials, vol. 5, No. 11, Nov. 28, 2017, pp. 116107-1-116107-11.

Passlack et al., "Gallium oxide on gallium arsenide: Atomic structure, materials, and devices," Chapter 12, III-V Semiconductor Hetereostructures: Physics and Devices, edited by Will Z. Cai, Research Signpost, Jan. 1, 2003, pp. 1-29.

Peelaers et al., "Deep acceptors and their diffusion in Ga2O3," APL Materials, vol. 7, No. 2, Jan. 8, 2019, pp. 322519-1-022519-6.

Rafique et al., "Towards High-Mobility Heteroepitaxial β-Ga2O3 on Sapphire—Dependence on The Substrate Off-Axis Angle," Physica Status Solidi A, Nov. 22, 2017, 9 pages.

Teraguchi et al., "Vacancy ordering of Ga2Se3 films by molecular beam epitaxy," Applied Physics Letters, vol. 59, No. 5, Jul. 29, 1991, pp. 567-569.

Thesis et al., "The Reactivity of Ozone Incident onto the Surface of Perovskite Thin Films Grown by MBE," Proceedings of the Ninth International Conference on High Temperature Materials Chemistry, Penn State University, University Park, PA, May 19-23, 1997, 7 pages.

Tsai et al., "β-Ga2O3 growth by plasma-assisted molecular beam epitaxy," Journal of Vacuum Science and Technology A, vol. 28, No. 2, Mar. 10, 2010, pp. 354-359.

Ulbricht et al., "Adsorption-controlled growth of EuO by molecular-beam epitaxy," Applied Physics Letters, vol. 93, No. 10, Sep. 10, 2008, pp. 102105-1-102105-3.

Vogt et al., "Comparison of the growth kinetics of In2O3 and Ga2O3 and their suboxide desorption during plasma-assisted molecular beam epitaxy," Applied Physics Letters, vol. 109, No. 6, Aug. 8, 2016, pp. 062103-1-062103-4.

Vogt et al., "Metal-oxide catalyzed epitaxy (MOCATAXY): the example of the O plasma-assisted molecular beam epitaxy of β-(AlxGa1-x)2O3/β-Ga2O3 heterostructures," Applied Physics Express, vol. 11, No. 11, Oct. 25, 2018, pp. 115503-1-115503-4.

Vogt et al., "Quantitative subcompound-mediated reaction model for the molecular beam epitaxy of III-VI and IV-VI thin films: Applied to Ga2O3, In2O3, and SnO2," Physical Review Materials, vol. 2, No. 12, Dec. 20, 2018, pp. 120401-1-120401-5.

Vogt et al., "Reaction kinetics and growth window for plasma-assisted molecular beam epitaxy of Ga2O3: Incorporation of Ga vs. Ga2O desorption," Applied Physics Letters, vol. 108, No. 7, Feb. 17, 2016, pp. 072101-1-072101-4.

(56) References Cited

OTHER PUBLICATIONS

Vogt et al., "The competing oxide and sub-oxide formation in metal-oxide molecular beam epitaxy," Applied Physics Letters, vol. 106, No. 8, Feb. 25, 2015, pp. 081910-1-081910-4.
Vogt, P., "Growth Kinetics, Thermodynamics, and Phase Formation of group-III and IV oxides during Molecular Beam Epitaxy," Dissertation, Humboldt University of Berlin, Jul. 11, 2017, 135 pages.
Wang et al., "Band Gap and Band Offset of Ga2O3and (AlxGa1-x)2O3 Alloys," Physical Review Applied, vol. 10, No. 1, Jul. 31, 2018, pp. 011003-1-011003-7.
Wei et al., "β-Ga2O3 thin film grown on sapphire substrate by plasma-assisted molecular beam epitaxy," Journal of Semiconductors, vol. 40, No. 1, Jan. 2019, 5 pages.
Yu et al., "Growth and physical properties of Ga2O3 thin films on GaAs(001) substrate by molecular-beam epitaxy," Applied Physics Letters, vol. 82, No. 18, May 5, 2003, pp. 2978-2980.
Zacherle et al., "Ab initio calculations on the defect structure of β-Ga2O3," Physical Review B, vol. 87, No. 23, Jun. 21, 2013, pp. 235206-1-235206-10.
Zhang et al., "MOCVD grown epitaxial β-Ga2O3 thin film with an electron mobility of 176 cm2/V s at room temperature," APL Materials, vol. 7, No. 2, Dec. 12, 2018, pp. 002506-1-022506-6.

* cited by examiner

SUBOXIDE MOLECULAR-BEAM EPITAXY AND RELATED STRUCTURES

GOVERNMENT SUPPORT

This invention was made with government support under Agreement No. HR0011-18-3-0004 awarded by The Defense Advanced Research Projects Agency (DARPA), under Grant Nos. DMR1539918 and CMMI1825538 awarded by the National Science Foundation, under Grant No. FA9550-18-1-0508 awarded by the United States Air Force and under Grant No. 80NSSC18K1168 awarded by the National Aeronautics & Space Administration. The U.S. Government has certain rights in this invention

FIELD OF THE DISCLOSURE

The present disclosure relates to molecular-beam epitaxy (MBE) and more particularly to suboxide MBE (S-MBE) and related device structures.

BACKGROUND

Molecular-beam epitaxy (MBE) involves the growth of epitaxial thin films from molecular beams of source materials. Conventional techniques include solid-source MBE where molecular beams of elements are evaporated from heated solid source materials or gas-source MBE where molecular beams are originated from gas source materials that are provided from individual gas cylinders that are plumbed into MBE systems. Certain gas-source MBE may include metal-organic MBE where gas sources include metal-organic molecules. In the case of gallium (Ga) oxide formed by MBE, solid-source MBE involves generating a molecular beam of Ga from a heated crucible and gas-source MBE involves providing a metal-organic source like trimethylgallium together with an active species of oxygen (O).

Oxides of metals or metalloids are of particular interest for use in semiconductor devices for high-power electronic applications. It is often desired to grow oxide films by MBE in an adsorption-controlled growth regime where excess amounts of source metals or metalloids are supplied to provide improved crystal quality, smooth surface morphology, suppressed formation of undesired oxidation states, and suppressed formation of electrically compensating defects. Growth rates and film quality of such oxides may be limited by conventional MBE techniques due to the formation and subsequent desorption of volatile precursor species. For example, suboxides may initially form on a growth surface before either being desorbed from the growth surface or further oxidized to form the intended oxide layer. In the adsorption-controlled growth regime, growth rates are reduced since there is not enough active species of O to further oxidize the suboxides to the intended oxide.

The art continues to seek improved MBE techniques and corresponding films that are capable of overcoming challenges associated with conventional MBE.

SUMMARY

The present disclosure relates to molecular-beam epitaxy (MBE) and more particularly to suboxide MBE (S-MBE) and related device structures. S-MBE is disclosed that includes the use of a molecular beam of a suboxide that may be subsequently oxidized in a single step reaction to form an oxide film. By way of example, for a gallium oxide ($Ga_2O_3$) film, a molecular beam including a suboxide of gallium ($Ga_2O$) may be provided. S-MBE may be performed in adsorption-controlled regimes where there is an excess of source material containing species in order to promote high growth rates for oxide films with improved crystallinity. Source mixtures for providing molecular beams of suboxides are disclosed that include mixtures of a particular element and an oxide of the element in ratios that promote such adsorption-controlled growth regimes. Related structures include oxide films having increased thickness with reduced crystal defects, such as a film that includes a single polymorph of gallium oxide in certain examples.

In one aspect, an MBE method comprises: providing a molecular beam that comprises a suboxide of an element; providing an oxidant species; and growing a oxide film of the element by oxidizing the suboxide with the oxidant species, wherein the oxide film is grown with a growth rate in a range from 0.5 microns per hour (μm/hr) to 5 μm/hr. In certain embodiments, the growth rate is in a range from 1 μm/hr to 5 μm/hr. In certain embodiments, the element comprises at least one of aluminum, cerium, gallium, germanium, hafnium, indium, lanthanum, praseodymium, silicon, tin, tantalum, and zirconium. The element may comprise gallium, the suboxide may comprise $Ga_2O$, and the oxide film may comprise $Ga_2O_3$. In certain embodiments, a flux ratio in the molecular beam of an amount of the $Ga_2O$ to an amount of the oxidant species is greater than 1. The flux ratio may further be in a range from greater than 1 to 10. In certain embodiments, the molecular beam is produced from a source mixture that includes elemental gallium and an oxide of gallium. The source mixture may be heated to produce the molecular beam and a purity of the molecular beam is at least 99.5% $Ga_2O$. In certain embodiments, a mole fraction of oxygen in the source mixture is between 0.333 and 0.6. In certain embodiments, providing the molecular beam comprises heating the source mixture to a temperature that is in a range from 907 K to 1594 K, or to a temperature that is less than or equal to 1500 K. In certain embodiments, a purity of the molecular beam of the $Ga_2O$ is at least 99%. The MBE method may further comprise supplying at least one of a molecular beam of SnO, a molecular beam of SiO, and a molecular beam of GeO to provide an n-type dopant for the $Ga_2O_3$.

In another aspect, a device comprises: a substrate; and a layer of gallium oxide on the substrate, wherein the layer of gallium oxide comprises a single polymorph of gallium oxide with a thickness in a range from 1 μm to 20 μm. In certain embodiments, the thickness is in a range from 1 μm to 5 μm. The layer of gallium oxide may comprise $Ga_2O_3$. In certain embodiments, the single polymorph comprises monoclinic gallium oxide ($\beta$-$Ga_2O_3$). The substrate may comprise a diameter in a range from 2 inches to 12 inches. In certain embodiments, the layer of gallium oxide is doped with an n-type impurity that comprises at least one of tin, germanium, and silicon. In certain embodiments, a concentration of gallium vacancy defects in the layer of gallium oxide is in a range from to $1\times10^{14}$ $cm^{-3}$ to $1\times10^{17}$ $cm^{-3}$.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
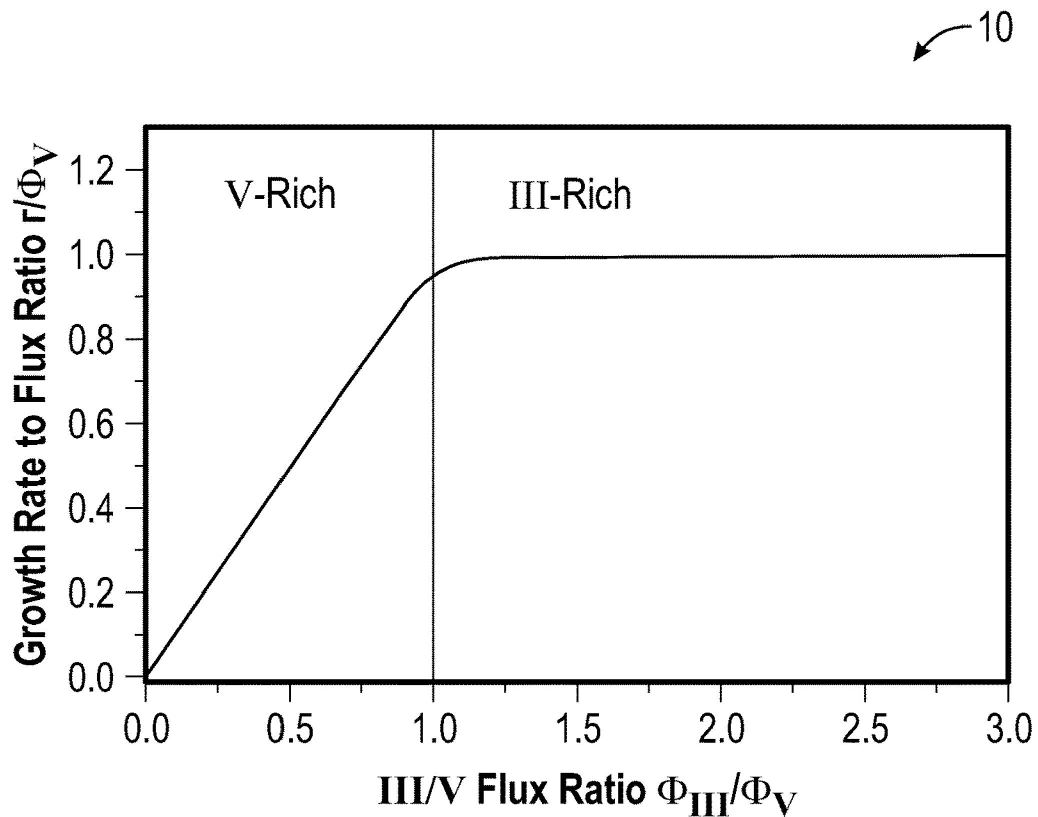
FIG. 1A is a schematic plot illustrating a growth rate as observed for III-V compounds, in this case gallium nitride (GaN), as a function of III/V flux ratio when a group III cation is supplied by a molecular beam of a group III element (e.g., Ga).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to molecular-beam epitaxy (MBE) and more particularly to suboxide MBE (S-MBE) and related device structures. S-MBE is disclosed that includes the use of a molecular beam of a suboxide that may be subsequently oxidized in a single step reaction to form an oxide film. By way of example, for a gallium oxide ($Ga_2O_3$) film, a molecular beam including a suboxide of gallium ($Ga_2O$) may be provided. S-MBE may be performed in adsorption-controlled regimes where there is an excess of source material containing species in order to promote high growth rates for oxide films with improved crystallinity. Source mixtures for providing molecular beams of suboxides are disclosed that include mixtures of a particular element and an oxide of the element in ratios that promote such adsorption-controlled growth regimes. Related structures include oxide films having increased thickness with reduced crystal defects, such as a film that includes a single polymorph of gallium oxide in certain examples.

As used herein, "suboxide MBE" refers to an MBE growth process that utilizes at least one molecular beam of a suboxide of an element. In certain embodiments, at least one molecular beam of the suboxide of the element may be combined with an active oxygen species, or oxidant species, to promote thin film growth of an oxide of the element. By way of example, providing a suboxide for growth of a gallium sesquioxide ($Ga_2O_3$) film may include supplying a molecular beam of a suboxide of gallium such as $Ga_2O$ that is subsequently oxidized to form the $Ga_2O_3$. As disclosed herein, suboxide MBE may also be referred to S-MBE. In addition to gallium sesquioxide, $Ga_2O_3$ may also be referred to as gallium trioxide, or even generally as gallium oxide.

By way of example, the following disclosure is provided detailing reaction behaviors of gallium nitride (GaN) and $Ga_2O_3$ in MBE. However, the principles of the present disclosure are also applicable for the MBE growth of aluminum nitride (AlN), indium nitride (InN), aluminum gallium nitride (AlGaN), indium aluminum gallium nitride (AlInGaN), III-VI compounds, II-VI compounds, or any oxides of elements aluminum (Al), cerium (Ce), gallium (Ga), germanium (Ge), hafnium (Hf), indium (In) including $In_2O_3$, lanthanum (La), praseodymium (Pr), silicon (Si), tin (Sn), tantalum (Ta), and zirconium (Zr).

$Ga_2O_3$ synthesized in its various polymorphs such as rhomboheral ($\alpha$-$Ga_2O_3$), monoclinic ($\beta$-$Ga_2O_3$), cubic spinel ($\gamma$-$Ga_2O_3$), hexagonal ($\varepsilon$-$Ga_2O_3$), and orthorhombic ($\kappa$-$Ga_2O_3$), is an emerging material for use in semiconductor devices for high-power electronics. This is due to its large band gap of about 5 electron-volts (eV) and very high breakdown field of up to 8 megavolts (MV) $cm^{-1}$. The band gap of $Ga_2O_3$ may be widened by alloying $Ga_2O_3$ with $Al_2O_3$ to form $(Al_xGa_{1-x})_2O_3$. For example, the synthesis of $(Al_xGa_{1-x})_2O_3/Ga_2O_3$ heterostructures with high Al content x is desired for high-power transistors with large band gap offsets.

Conventional MBE of $Ga_2O_3$ involves supplying monoatomic Ga and an active oxygen species or oxidant, such as ozone or any other activated O-species including oxygen plasma-assisted MBE as well as other chemical oxidants including $N_2O$ or $NO_2$, during growth. Such conventional MBE is strongly limited by the formation and subsequent desorption of volatile suboxides of gallium ($Ga_2O$) during growth. In the adsorption-controlled regime where there is an excess of Ga species, the growth rate of the resulting $Ga_2O_3$ film on a substrate strongly decreases with increasing Ga flux ($\phi_{Ga}$) because not enough oxygen is available to oxidize the physisorbed $Ga_2O$ to $Ga_2O_3$ (s) and the $Ga_2O$ tends to desorb from the hot growth surface of the substrate. At sufficiently high $\phi_{Ga}$, film growth stops, and may even go negative such that the $Ga_2O_3$ film can be etched. This effect is enhanced as the growth temperature ($T_G$) increases due to the thermally activated desorption of $Ga_2O$ from the growth surface.

The decreasing growth rate of $Ga_2O_3$ may be microscopically explained by a complex two-step reaction mechanism. In a first reaction step, all Ga oxidizes to form the suboxide $Ga_2O$ via the reaction equation:

$$2Ga(a)+O(a)\rightarrow Ga_2O(a,g), \quad (1)$$

with adsorbate and gaseous phases denoted as a and g, respectively. The $Ga_2O$ formed may either desorb from the growth surface in the oxygen-deficient regime or at an elevated $T_G$. The $Ga_2O$ may also be further oxidized to $Ga_2O_3$ via a second reaction step through the reaction equation:

$$Ga_2O(a)+2O(a)\rightarrow Ga_2O_3(s), \quad (2)$$

with the solid phase denoted as s. This two-step reaction mechanism and the resulting $Ga_2O$ desorption define the growth rate-limiting step for the conventional MBE of $Ga_2O_3$ and other related materials, resulting in a narrow growth window associated with very low growth rates in the adsorption-controlled regime. A similar growth rate-limiting behavior, based on this two-step reaction mechanism, is also provided during conventional MBE growth of other III-VI compounds such as $In_2O_3$ and IV-VI compounds such as $SnO_2$.

According to embodiments of the present disclosure, MBE techniques are disclosed that provide a single-step reaction mechanism of films such as III-VI and IV-VI compounds. While established MBE techniques provide a single-step reaction mechanism for the growth of III-V and II-VI materials, the different electronic configurations of III-VI and IV-VI compounds result in a two-step reaction mechanism when these compounds are grown by conventional MBE. These same differences in electronic configuration underly the different compound stoichiometries of III-VI and IV-VI materials compared with III-V and II-VI materials. In certain embodiments, the single-step reaction may be provided by S-MBE where the first reaction step, or reaction equation (1), described above for conventional MBE is avoided by directly supplying a suboxide of gallium (e.g., $Ga_2O$ (g)) as a molecular beam to a growth front on a substrate surface. Using this approach, the growth rate-limiting step in the adsorption-controlled regime for conventional MBE growth of $Ga_2O_3$ is bypassed by removing the oxygen consuming step for formation of $Ga_2O$ that would otherwise occur on the substrate. In this regard, S-MBE enables the synthesis of $Ga_2O_3$ in the highly adsorption-controlled regime, at growth rates greater than 1 micron per hour (μm/hr), with dramatically improved crystal quality of $Ga_2O_3/Al_2O_3$ heterostructures at relatively low $T_G$. The higher growth rates provided by S-MBE are competitive with other established growth methods used in the semiconductor industry such as chemical vapor deposition (CVD) or metal-organic chemical vapor deposition (MOVPE) and moreover, S-MBE may lead to improved crystal properties of the obtained thin films. In this regard, an improvement of n-type donor mobilities in S-MBE grown $Ga_2O_3$ thin films doped with impurities such as Sn, Ge, and/or Si may be realized. Additionally, the relatively low $T_G$ at which it becomes possible to grow high-quality films by S-MBE is enabling for materials integration where temperatures are limited, such as back end of line (BEOL) processes.

Figure 1B:
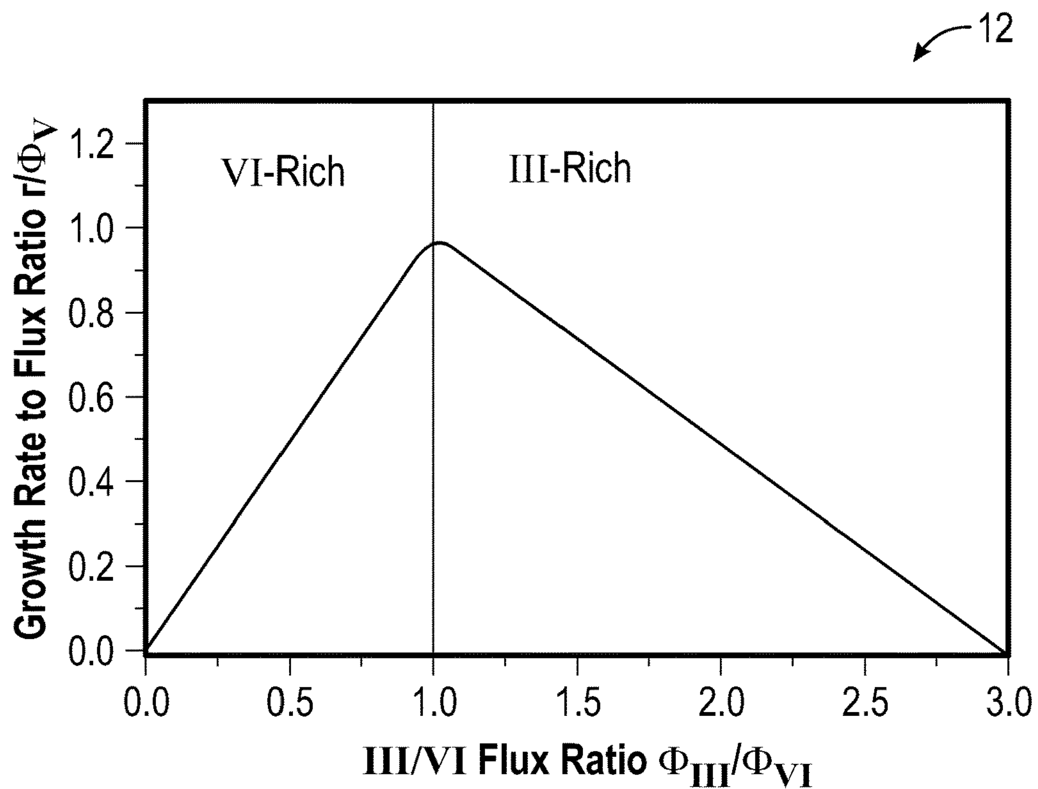
FIG. 1B is a schematic plot illustrating a growth rate as observed for III-VI compounds, in this case gallium oxide ($Ga_2O_3$), as a function of III/VI flux ratio when the group III cation is supplied by a molecular beam of a group III element (e.g., Ga).
Figure 1C:
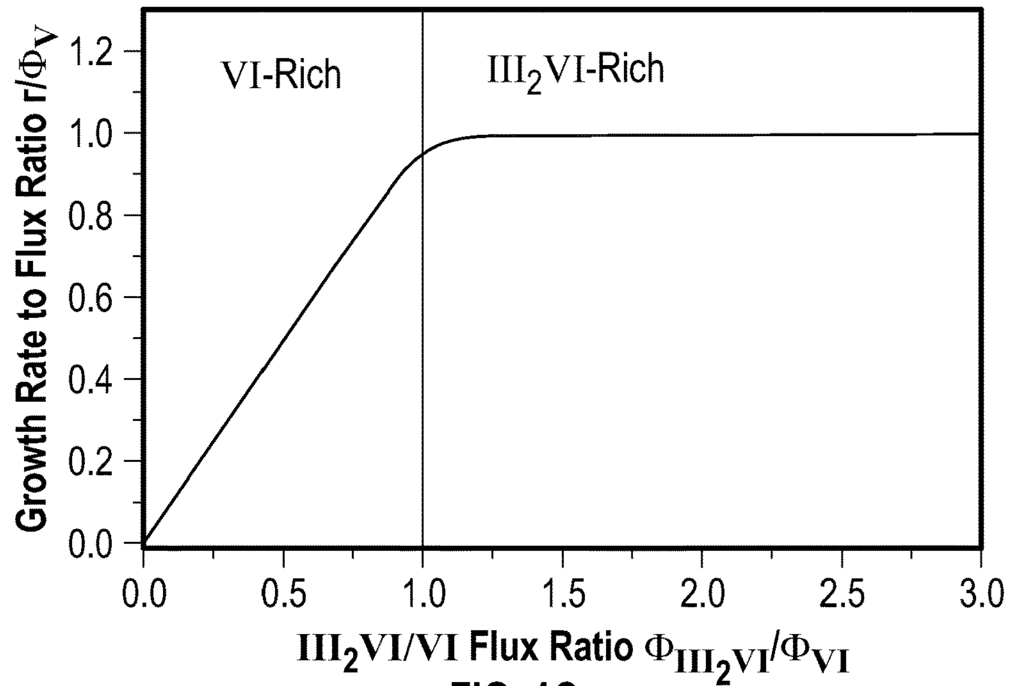
FIG. 1C is a schematic plot illustrating growth kinetics of III-VI compounds, in this case $Ga_2O_3$, as a function of $III_2VI/VI$ flux ratio when the group III cation is supplied by a molecular beam of a $III_2VI$ subcompound containing a group III constituent (e.g., $Ga_2O$).

FIGS. 1A-1C are schematic plots for comparing measured and predicted reaction kinetics during the MBE growth of III-V and III-VI materials. In particular, FIGS. 1A-1C are schematic plots representing how growth rate depends on cation flux during MBE growth of different types of compounds, where both axes are normalized by anion flux. FIG. 1A is a schematic plot 10 illustrating a growth rate as observed for III-V compounds, in this case GaN, as a function of the III/V flux ratio (e.g., $\phi_{Ga}/\phi_N$) when the group III cation is supplied by a molecular beam of the group III element (e.g., Ga). FIG. 1B is a schematic plot 12 illustrating a growth rate as observed for III-VI compounds, in this case $Ga_2O_3$, as a function of the III/VI flux ratio (e.g., $\phi_{Ga}/\phi_O$) when the group III cation is supplied by a molecular beam of the group III element (e.g., Ga). FIG. 1C is a schematic plot 14 illustrating anticipated growth rates of III-VI compounds, in this case $Ga_2O_3$, as a function of the $III_2VI/VI$ flux ratio $$\left(\text{e.g., } \frac{\Phi_{Ga_2O}}{\Phi_O}\right)$$

when the group III cation is supplied by a molecular beam of a $III_2VI$ subcompound containing a group III constituent (e.g., $Ga_2O$). All schematic growth rate evolutions in FIGS. 1A-1C are normalized by the respective fluxes of active available group V ($\phi_V$) and group VI elements ($\phi_{VI}$) at constant $T_G$. Anion-rich regimes are indicated as V-rich (FIG. 1A) or VI-rich (FIGS. 1B-1C) and cation-rich regimes are indicated as III-rich (FIGS. 1A-1B) or $III_2VI$-rich (FIG. 1C). The units of each axis in FIGS. 1A-1C are selected to provide regime crossover at an x-axis value of 1.0. As illustrated in FIGS. 1A-1C, the growth rate of GaN and $Ga_2O_3$ increases linearly with increasing $\phi_{Ga}$ in the V-rich (e.g., N) regime of FIG. 1A and the VI-rich regimes (e.g., O) of FIGS. 1B and 1C respectively. In this manner, the incorporation of Ga is limited by the impinging Ga flux or $Ga_2O$ flux in a Ga-transport or $Ga_2O$-transport limited growth regime.

For GaN MBE as illustrated in FIG. 1A, once the supplied $\phi_{Ga}$ exceeds the flux $\phi_N$ of active available N, the growth rate saturates to be independent of the $\phi_{Ga}/\phi_N$ ratio, and thereby be limited by $\phi_N$ and $T_G$. The measured plateau in growth rate for GaN MBE in the III-rich (Ga) regime results from its single-step reaction kinetics. Here, Ga reacts directly with activated N via the reaction equation:

$$Ga(a)+N(a)\rightarrow GaN(s), \tag{3}$$

and excess Ga either adsorbs or desorbs off the growth surface depending upon $\phi_N$ and $T_G$.

FIG. 1B depicts the reaction kinetics of $Ga_2O_3$ in the III-rich (Ga) regime by supplying $\phi_{Ga}$. Here, the growth rate linearly decreases with increasing $\phi_{Ga}$, and the growth eventually stops at $\phi_{Ga}\geq 3\phi_O$ (in growth rate units). In this manner, desorbing $Ga_2O$ removes Ga and O from the growth surface that cannot contribute to $Ga_2O_3$ formation, leading to the decreasing growth rate in the III-rich regime. This behavior may be microscopically governed by the two-step reaction process described above and is fundamentally different from the single-step reaction kinetics governing the MBE of GaN as illustrated in FIG. 1A.

In FIG. 1C, the anticipated growth kinetics of $Ga_2O_3$ while using a $Ga_2O$ molecular beam is depicted, showing a constant growth rate in the $III_2VI$-rich ($Ga_2O$) regime. The $III_2VI$-rich regime in FIG. 1C is provided for a flux ratio of $III_2VI$ (e.g., $Ga_2O$) flux to VI (e.g., O) flux is greater than 1, or in a range from greater than 1 to 30, or in a range from greater than 1 to 10. Excess $Ga_2O$ that cannot be oxidized to $Ga_2O_3$ may either accumulate or desorb off the growth surface without consuming or removing active O from its adsorbate reservoir, in a manner similar to the growth of GaN as described for FIG. 1A. In this regard, embodiments of the present disclosure as provided by S-MBE may effectively achieve single-step reaction kinetics for $Ga_2O_3$ MBE. Based on the knowledge of observed and anticipated growth kinetics for the growth of GaN and $Ga_2O_3$ by MBE provided in FIGS. 1A-1C, constant and highly scalable growth rates in the $Ga_2O$-rich regime may be achieved, allowing the ultra-fast synthesis of $Ga_2O_3$ thin films with improved crystallinity at relatively low $T_G$ by S-MBE.

Conventional use of a $Ga_2O$ (g) molecular beam to grow $Ga_2O_3$ (s) thin films by MBE in the O-rich regime has been demonstrated by placing a stoichiometric solid of the compound $Ga_2O_3$ into a crucible and using it as an MBE source. Possible reaction equations that produce a $Ga_2O$ molecular beam by the thermal decomposition of $Ga_2O_3$ are:

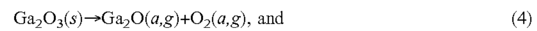

$$Ga_2O_3(s)\rightarrow Ga_2O(a,g)+O_2(a,g), \text{ and} \tag{4}$$

$$Ga_2O_3(s)\rightarrow Ga_2O(a,g)+2O(a,g). \tag{5}$$

One disadvantage of using a solid source of $Ga_2O_3$ for MBE is that the resulting $Ga_2O$ (g) molecular beam leaving the crucible of the MBE effusion cell contains O-species, such as undefined beams of $Ga_2O/O_2$ and/or $Ga_2O/O$. This leads to undefined adsorbate densities of $Ga_2O$ and O species on the growth surface, making the reproducible and controlled growth of $Ga_2O_3$ thin films very challenging. The other disadvantage is the low achievable $\Phi_{Ga_2O}$ at relatively high MBE effusion cell temperatures that may exceed 1600° C., thereby hampering the synthesis of $Ga_2O_3$ at industrially relevant growth rates of at least 1 μm/hr with device-relevant film quality. $Ga+Ga_2O_3$-mixed sources producing a $Ga_2O$ molecular beam have been demonstrated without providing the synthesis of $Ga_2O_3$ thin films. Using this mixed source, a $Ga_2O$ (g) molecular beam may be produced by the chemical reaction equation:

$$4Ga(l)+Ga_2O_3(s)\rightarrow 3Ga_2O(s,g), \tag{6}$$

with the liquid phase denoted as l. This method utilizes the thermodynamic and kinetic properties of $Ga+Ga_2O_3$ mixtures favoring reaction under MBE conditions.

According to embodiments of the present disclosure for S-MBE of $Ga_2O_3$, Ga-rich and $Ga_2O_3$-rich mixtures of $Ga+Ga_2O_3$ may be employed with stoichiometries according the reaction equations:

$$5Ga\ (l) + Ga_2O_3\ (s) \xrightarrow{K_{Ga\text{-}rich}} 3Ga_2O\ (g) + Ga\ (l), \tag{7}$$

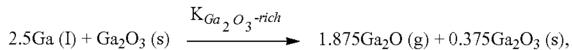

$$2.5Ga\ (l) + Ga_2O_3\ (s) \xrightarrow{K_{Ga_2O_3\text{-}rich}} 1.875Ga_2O\ (g) + 0.375Ga_2O_3\ (s), \tag{8}$$

respectively. The corresponding reaction rate constants $K_{Ga}$-rich and $K_{Ga_2O_3}$-rich define the production rate of $Ga_2O$ (g) at a given temperature ($T_{mix}$) of the Ga+$Ga_2O_3$ source mixture. The flux of $Ga_2O$ (g) in the molecular beam emanating from the mixed Ga+$Ga_2O_3$ sources may be significantly larger than that of Ga (g) emanating from the same source. The resulting flux ratio where $Ga_2O$/Ga is greater than 1 may provide a more controllable and cleaner growth environment than previously accessible by decomposing a stoichiometric $Ga_2O_3$ source, which produces molecular beam ratios of $Ga_2O/O_2$ or $Ga_2O$/O. In this regard, the growth surface of the substrate during film growth using S-MBE may only include controllable densities of $Ga_2O$ and reactive O adsorbates.

Figure 2:
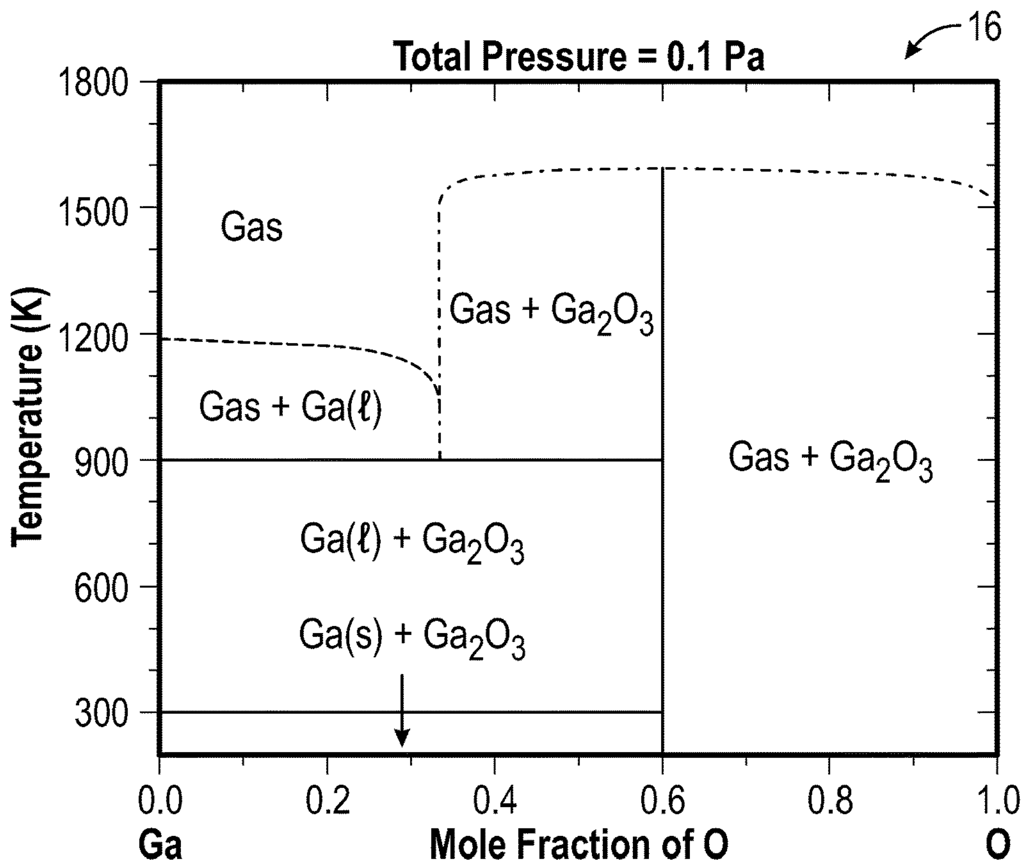
FIG. 2 illustrates a calculated Ga—O phase diagram under a constant pressure of 0.1 pascal (Pa).

According to embodiments of the present disclosure, a $Ga_2O_3$-rich source mixture enables higher $T_{mix}$ and increased, purer $Ga_2O$ (g) molecular beams than a Ga-rich mixture, thereby providing S-MBE that achieves higher growth rates. As used herein, a $Ga_2O_3$-rich source mixture may refer to a mixture of Ga (l) and $Ga_2O_3$ (s) that when heated to a temperature where the $Ga_2O$ (g) that it evolves has a vapor pressure of 0.1 Pa (a vapor pressure typical for MBE growth) emits a molecular beam containing a ratio of $Ga_2O$ to elemental Ga in the gas phase that is greater than 199, i.e., the molecular beam is at least 99.5% $Ga_2O$. This experimental observation may be confirmed by thermodynamic calculations of the phase diagram of Ga (l)+$Ga_2O_3$ (s) mixtures. In this regard, FIG. 2 illustrates a calculated Ga—O phase diagram 16 under a constant pressure of 0.1 pascal (Pa) that shows that at a $T_{mix}$ below a three-phase equilibrium of gas+Ga (l)+$Ga_2O_3$ (s) around 907 Kelvin (K), a two-phase region of Ga (l)+$Ga_2O_3$ (s) forms, which does not change with respect to temperature for a mole fraction of oxygen between 0 and 0.6. All thermodynamic calculations in the present disclosure were performed using a scientific group thermodata europe (SGTE) substance database (SSUB5) within a Thermo-Calc software. For $T_{mix}$ above 907 K, the two-phase regions are gas+Ga (l) when the mole fraction of oxygen is below one third, corresponding to Ga-rich mixtures as described herein, and gas+$Ga_2O_3$ (s) when the mole fraction of oxygen is between one 0.333 and 0.6, corresponding to as $Ga_2O_3$-rich mixtures as described herein. These two-phase regions become a single gas-phase region at $T_{mix}$ values of 907 to 1189 K for Ga-rich mixtures and at $T_{mix}$ values 907 to 1594 K for $Ga_2O_3$-rich mixtures, respectively. As further illustrated in the pressure versus temperature (P-T) phase diagrams of FIGS. 3A and 3B, all of these phase transition temperatures decrease with decreasing pressure.

Figure 3B:
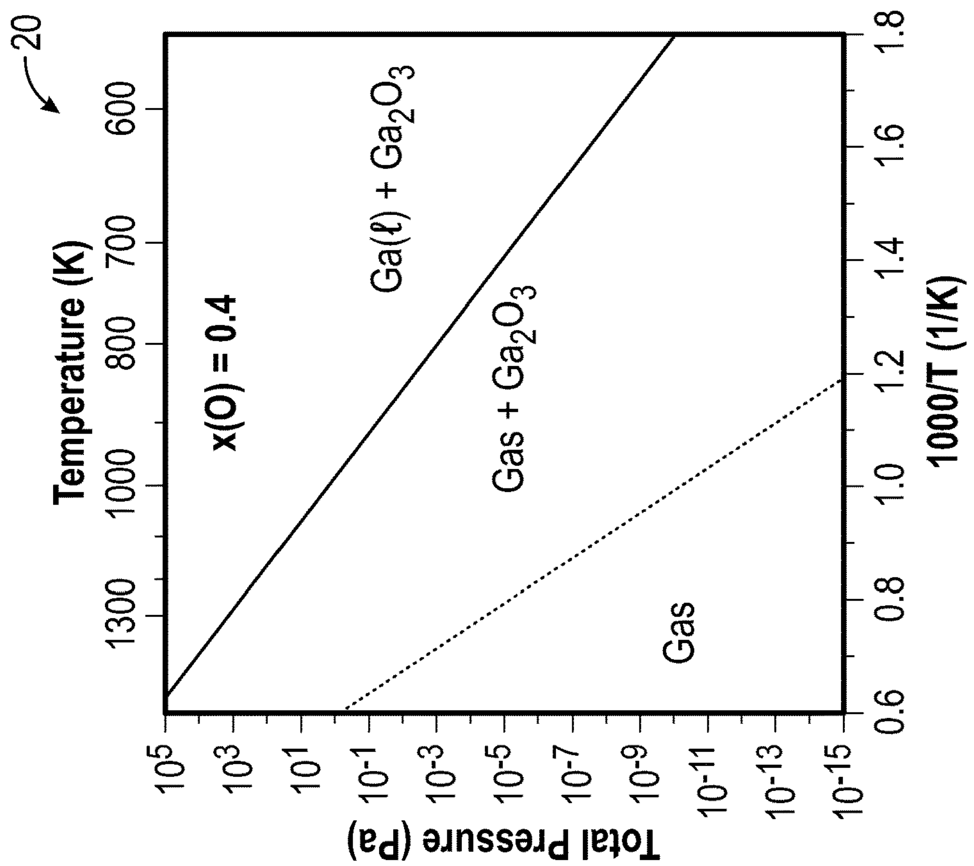
FIG. 3B illustrates a total Ga—O pressure versus temperature phase diagram at a fixed mole fraction of oxygen x(O) of 0.4, corresponding to a $Ga_2O_3$-rich mixture.
Figure 3A:
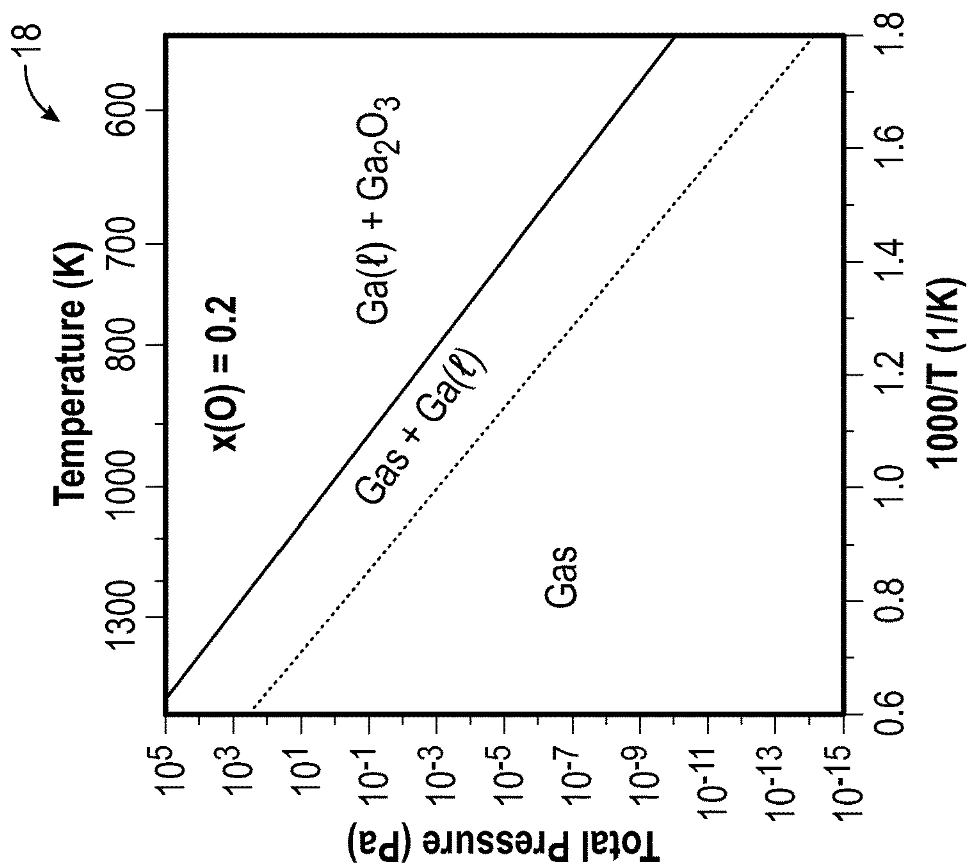
FIG. 3A illustrates a total Ga—O pressure versus temperature phase diagram at a fixed mole fraction of oxygen x(O) of 0.2, corresponding to a Ga-rich mixture.

FIG. 3A illustrates a Ga—O total pressure versus temperature phase diagram 18 at a fixed mole fraction of oxygen x(O) of 0.2, corresponding to a Ga-rich mixture. FIG. 3B illustrates a Ga—O total pressure versus temperature phase diagram 20 at a fixed mole fraction of oxygen x(O) of 0.4, corresponding to a $Ga_2O_3$-rich mixture. In order to contrast the difference between Ga-rich versus $Ga_2O_3$-rich mixtures, thermodynamic calculations were performed at the chosen oxygen mole fractions of x(O)=0.2 and x(O)=0.4. In FIGS. 3A and 3B, the solid lines denote a three-phase equilibrium between gas+Ga (l)+$Ga_2O_3$ (s) that is identical at x(O)=0.2 and x(O)=0.4. The dashed lines in FIGS. 3A and 3B denote an equilibrium between the gas and gas+Ga (l) phase regions for x(O)=0.2 and the gas and gas+$Ga_2O_3$ (s) phase regions for x(O)=0.4. Stated differently, the dashed lines represent respective boiling temperature/pressure values.

Figure 4B:
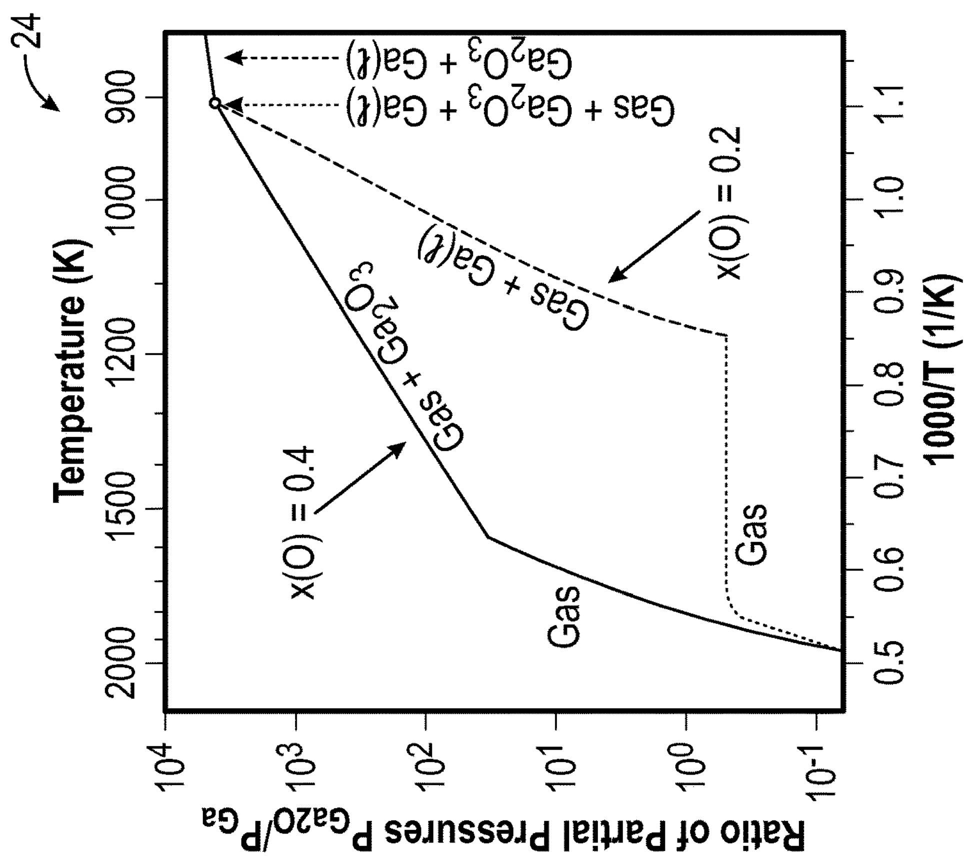
FIG. 4B illustrates a plot of a ratio of a partial pressure of $Ga_2O$ to that of Ga plotted as a function of temperature at a total pressure of 0.1 Pa for the Ga-rich mixture of x(O)=0.2 and the $Ga_2O_3$-rich mixture of x(O)=0.4 of FIG. 4A.
Figure 4A:
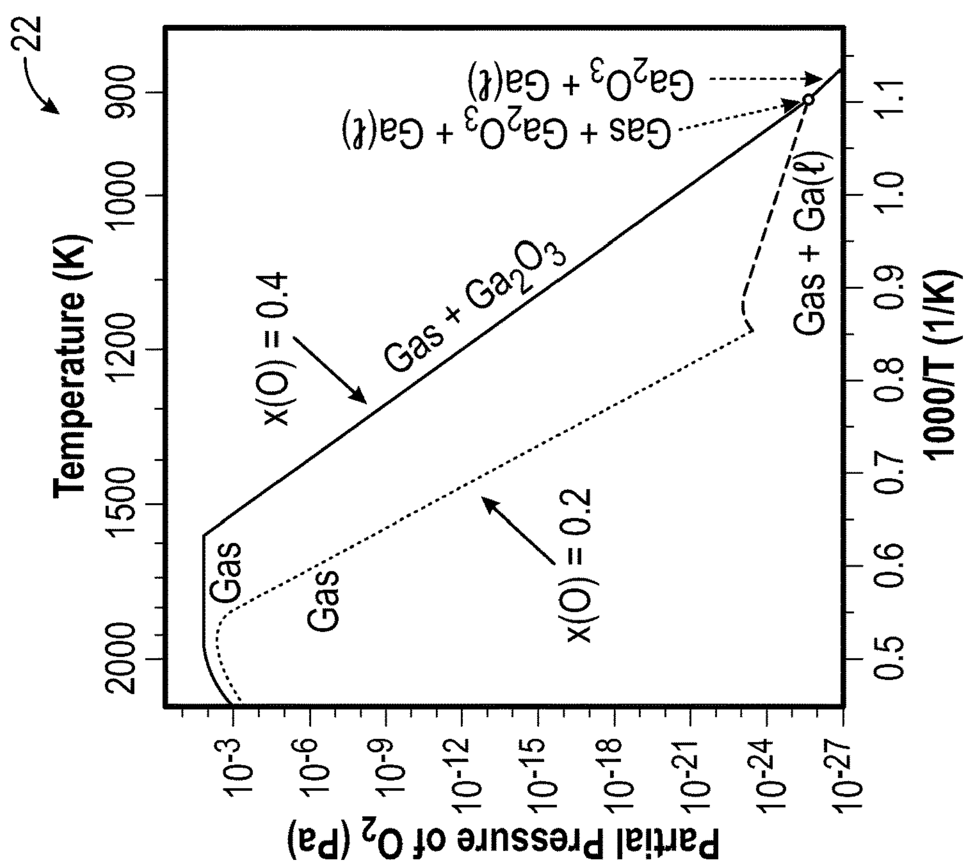
FIG. 4A illustrates a plot of a partial pressure of oxygen in a gas phase as a function of temperature at a total pressure of 0.1 Pa for a Ga-rich mixture at x(O)=0.2 and a $Ga_2O_3$-rich mixture at x(O)=0.4.

FIG. 4A illustrates a plot 22 of a partial pressure of oxygen in a gas phase as a function of temperature at a total pressure of 0.1 Pa for a Ga-rich mixture at x(O)=0.2 and a $Ga_2O_3$-rich mixture at x(O)=0.4. FIG. 4B illustrates a plot 24 of a ratio of a partial pressure of $Ga_2O$ to that of Ga plotted as a function of temperature at a total pressure of 0.1 Pa for the for the Ga-rich mixture of x(O)=0.2 and the $Ga_2O_3$-rich mixture of x(O)=0.4. In FIGS. 4A and 4B, the dashed lines denote mole fractions of oxygen at x(O)=0.2 and the solid lines denote mole fractions of oxygen at x(O)=0.4, respectively.

As illustrated in FIG. 4A, the oxygen partial pressure in the $Ga_2O_3$-rich mixture at x(O)=0.4 is orders of magnitude higher than that at x(O)=0.2 at relevant MBE growth temperatures. For example, the value of the partial pressure of oxygen at $T_{mix}$=1000 K for the mole fraction x(O)=0.2 is $5.6\times10^{-25}$ Pa and the value of the partial pressure of oxygen at $T_{mix}$=1000 K for the mole fraction of x(O)=0.4 is $4.5\times10^{-21}$ Pa. In this regard, the higher oxygen activity of $Ga_2O_3$-rich mixtures compared with Ga-rich mixtures makes it easier to form fully oxidized $Ga_2O_3$ thin films. At lower total pressure values, all lines shift to lower temperatures.

The thermodynamic calculations plotted in FIG. 4B show the ratio of the partial pressures of $Ga_2O$ to Ga in the gas phase as a function of the temperature of the Ga-rich mixture x(O)=0.2 and of the $Ga_2O_3$-rich mixture x(O)=0.4 where the total pressure is fixed at 0.1 Pa. The ratio of the partial pressures of $Ga_2O$ to Ga $$\left(\frac{P_{Ga_2O}}{P_{Ga}}\right)$$

in the Ga-rich mixture with x(O)=0.2 is much lower than the corresponding ratio in the $Ga_2O_3$-rich mixture x(O)=0.4. For example, the $P_{Ga_2O}/P_{Ga}$ ratio is 158 in the Ga-rich mixture and 1496 in the $Ga_2O_3$-rich mixture at a $T_{mix}$ value of 1000 K. The higher $Ga_2O$/Ga ratios are another reason that $Ga_2O_3$-mixtures are advantageous since higher $Ga_2O$/Ga ratios correspond to a purer $Ga_2O$ molecular beam, which more exactly satisfies the single-step formation reaction of $Ga_2O_3$ described above.

By way of example, a Ga metal (7N purity) and a $Ga_2O_3$ powder (5N purity) were used to provide a Ga+$Ga_2O_3$ mixture that was loaded into a 40 $cm^3$ aluminum oxide ($Al_2O_3$) crucible and inserted it into a commercial dual-filament, medium temperature MBE effusion cell. After mounting the effusion cell to a commercially available MBE system and evacuating the source, the Ga+$Ga_2O_3$ mixture was heated, out-gassed, and set for a desired $Ga_2O$ flux for S-MBE growth of $Ga_2O_3$. In certain embodiments, the Ga+$Ga_2O_3$ mixture is heated to a temperature ($T_{mix}$) that is less than or equal to 1000 K, or less than or equal to 1500 K, thereby reducing potential contamination from the crucible or other hot parts of the effusion cell that may otherwise form at higher temperatures. The flux of the $Ga_2O$ (g) molecular beam reaching the growth surface prior to and after growth was measured using a quartz crystal microbalance. After growth, x-ray reflectivity (XRR) was used to measure a thickness of the $Ga_2O_3$ films formed by S-MBE to determine a corresponding growth rate. Based on thermodynamic calculations, a purity of the $Ga_2O$ (g) molecular beam described above for a mole fraction x(O)=0.4 is at least 99.5%, or at least 99.9%, or at least 99.98%, thereby providing improve crystallinity with reduced defects and unwanted polymorphs in the resulting $Ga_2O_3$ film. In particular, the resulting $Ga_2O_3$ film may be grown with a single polymorph, such as $\beta$-$Ga_2O_3$, across a sapphire wafer with a diameter of at least 12 inches. In certain embodiments, a concentration of gallium vacancy defects in the $Ga_2O_3$ film may be less than $1\times10^{17}$ $cm^{-3}$, or less than $5\times10^{16}$ $cm^{-3}$, or less than $1\times10^{16}$ $cm^{-3}$, or in a range from $1\times10^{14}$ $cm^{-3}$ to $1\times10^{17}$ $cm^{-3}$. Additionally, the reduced crucible contamination provided by the lower Tux may provide a $Ga_2O_3$ film that is devoid of foreign species and/or contaminants.

Figure 5:
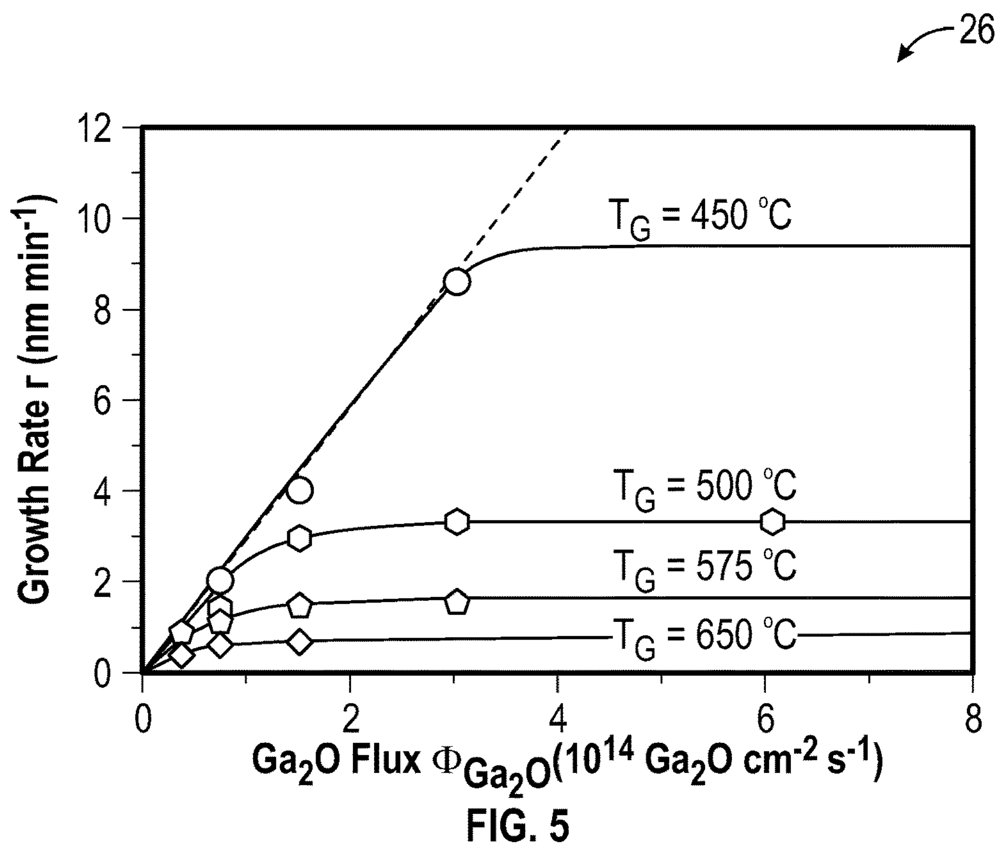
FIG. 5 is a plot that illustrates growth rates of $Ga_2O_3$ as a function of source flux at different growth temperatures and with a constant oxygen flux.

FIG. 5 is a plot 26 that illustrates growth rates of $Ga_2O_3$ as a function of source flux $\Phi_{Ga_2O}$ at different $T_G$ values with a constant oxygen flux $\Phi_O$. Measured growth rates of $Ga_2O_3(\bar{2}01)$ on Al2O3(0001) are provided as a function of $\Phi_{Ga_2O}$ at the different $T_G$ values. The $\Phi$ was provided by an oxidant in the form of a mixture of $O_2$ and approximately 80% $O_3$ and supplied continuously during growth. Solid lines represent model calculations while dashed lines denote an intersection between O-rich and $Ga_2O$-rich growth regimes to indicate a maximum available $\Phi_O$ for $Ga_2O$ to $Ga_2O_3$ oxidation at given $T_G$ values. Growth rates were obtained by measuring XRR fringe spacings, which are directly correlated to a corresponding thickness of the thin films as grown, or by measuring the film thickness by optical reflectivity in a microscope. The growth rates obtained follow the anticipated growth kinetics as illustrated by FIG. 1C. In the adsorption-controlled regime, an increase in $\Phi_{Ga_2O}$ at otherwise constant growth parameters does not lead to a decrease in the growth rate as observed for the conventional $Ga_2O_3$ MBE as illustrated by FIG. 1B, but instead results in a constant growth rate or a growth rate-plateau for all $T_G$ values. In this regard, S-MBE growth kinetics according to the present disclosure may overcome the growth rate-limiting step by using a $Ga_2O$ (g) suboxide molecular beam to provide a single-step reaction mechanism, thereby reducing the complexity of $Ga_2O_3$ reaction kinetics from the conventional two-step reaction mechanisms described by the reaction equations (1) and (2) above.

The S-MBE kinetics for the $Ga_2O_3$ growth may be described in a similar way as the conventional III-V reaction equation (3) above and for II-VI MBE. In this regard, a simple reaction-rate model describing the growth of $Ga_2O_3$ (s) and other III-VI and IV-VI compounds by S-MBE may be represented by the reaction equations:

$$\frac{dn_{Ga_2O}}{dt} = \Phi_{Ga_2O} - \kappa_{Ga_2O} n_{Ga_2O} n_O^2 - \gamma_{Ga_2O} n_{Ga_2O}, \quad (9)$$

$$\frac{dn_O}{dt} = \sigma\Phi_O - 2\kappa_{Ga_2O} n_{Ga_2O} n_O^2 - \gamma_O n_O, \text{ and} \quad (10)$$

$$\frac{dn_{Ga_2O_3}}{dt} = \Gamma = \kappa_{Ga_2O} n_{Ga_2O} n_O^2. \quad (11)$$

The $Ga_2O_3$, $Ga_2O$, and oxygen adsorbate densities are respectively denoted as $n_{Ga_2O_3}$, $n_{Ga_2O}$, and $n_O$ with a time derivative described by the operator d/dt. The reaction rate constant $\kappa_{Ga_2O}$ describes the growth rate $\Gamma$ of $Ga_2O_3$ (s) on the growth surface, and $\gamma_{Ga_2O}$ and $\gamma_O$ denote the desorption rate constants of $Ga_2O$ and oxygen adsorbates, respectively. The flux of available oxygen adsorbates, for $Ga_2O$ to $Ga_2O_3$ oxidation at a given $T_G$, is determined by its sticking coefficient $\sigma$ on the $Ga_2O_3$ growth surface and described by the arbitrarily chosen function:

$$\sigma(T_G) = \left[\sigma_0 \exp\left(-\frac{\Delta\sigma}{k_B(T_G - dT_G)}\right) + 1\right]^{-1} \quad (12)$$

with dimensionless pre-factor $\sigma_0$, energy $\Delta\sigma$, and temperature off-set $dT_G$. The function (12) reflects the decreasing probability of the oxygen species to adsorb as the $T_G$ is increased. In this manner, an effectively lower surface density of active oxygen for $Ga_2O$ oxidation and a corresponding lower growth rate is provided.

For a supplied flux of $\Phi_O$ corresponding to a background pressure of $1\times10^{-6}$ Torr involving mixtures of $O_2$ and approximately 10% $O_3$ and 80% $O_3$, the values of the variables given in the function (12) are: $\sigma_0$=40, $\Delta\sigma$=29 meV, and $dT_G$=675° C. These values are extracted by fitting the maximum growth rate defined as the plateau-regime as a function of $T_G$, for example as illustrated in FIG. 5. It is found that a does not depend on the concentration of active oxygen; but rather it only depends on the partial pressure of active oxygen. Thus, the active oxygen species may be scaled up or down by either changing the concentration of $O_3$ in the $O_3$ beam or by changing the partial pressure of $O_3$ in the MBE chamber. It is noted that $O_3$ supplies oxygen to the surface of the growing film as it decomposes by the reaction: $O_3$ (g)$\rightarrow O_2$ (g)+O (g). A similar behavior of an increasing desorption or recombination rate of active oxygen species with increasing $T_G$ has also been observed during oxygen plasma-assisted MBE using monoatomic Ga and oxygen molecular beams.

Figure 6:
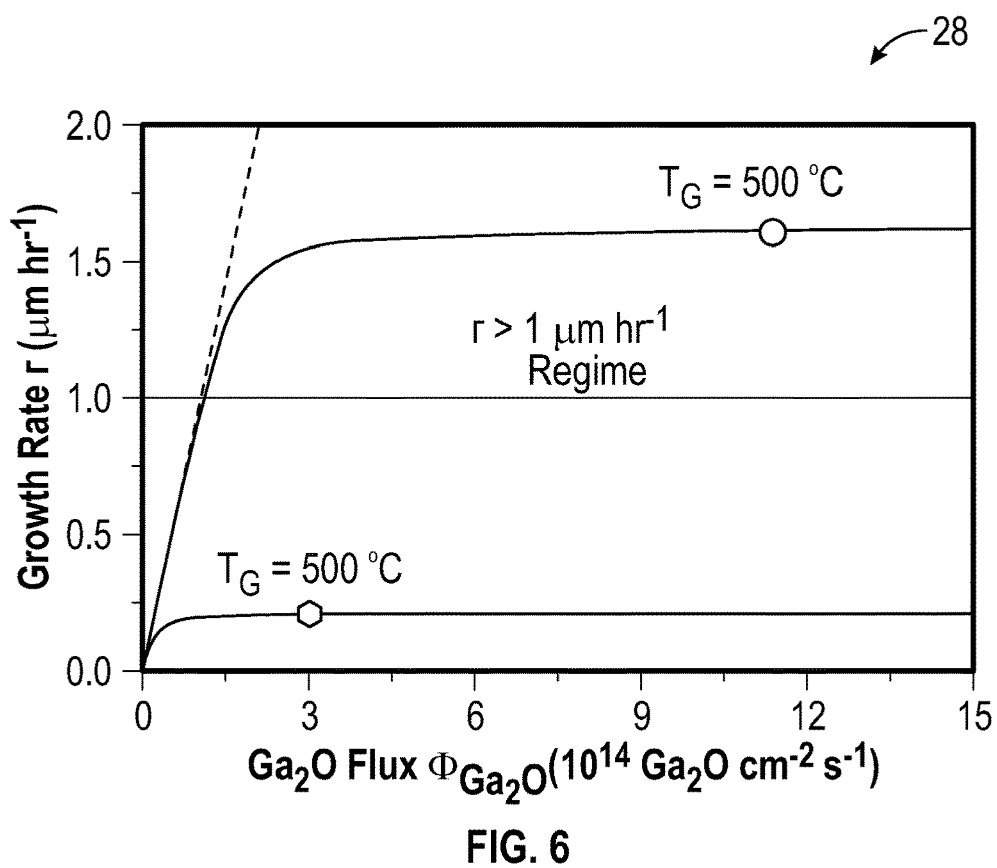
FIG. 6 is a plot that represents exemplary growth rates for samples according to suboxide molecular-beam epitaxy (S-MBE) principles of the present disclosure.

Based on this model, $\Phi_O$ may be scaled up in order to achieve $Ga_2O_3$ (s) growth rates that exceed 1 μm/hr. FIG. 6 is a plot 28 that represents exemplary growth rates according to S-MBE principles of the present disclosure. In FIG. 6, a growth rate of 1.6 μm/hr for a $Ga_2O_3$ thin film grown on $Al_2O_3(0001)$ is demonstrated at a $T_G$ of 500° C. for the data line that includes the data point plotted as a circle. For comparison, the data point plotted as a hexagon shows the highest possible growth rate at a five times lower active $\Phi_O$ and at the same $T_G$. In this regard, the above-described models for growth of $Ga_2O_3$ thin film according to S-MBE are provided that exceed 1 μm/hr.

Figure 7:
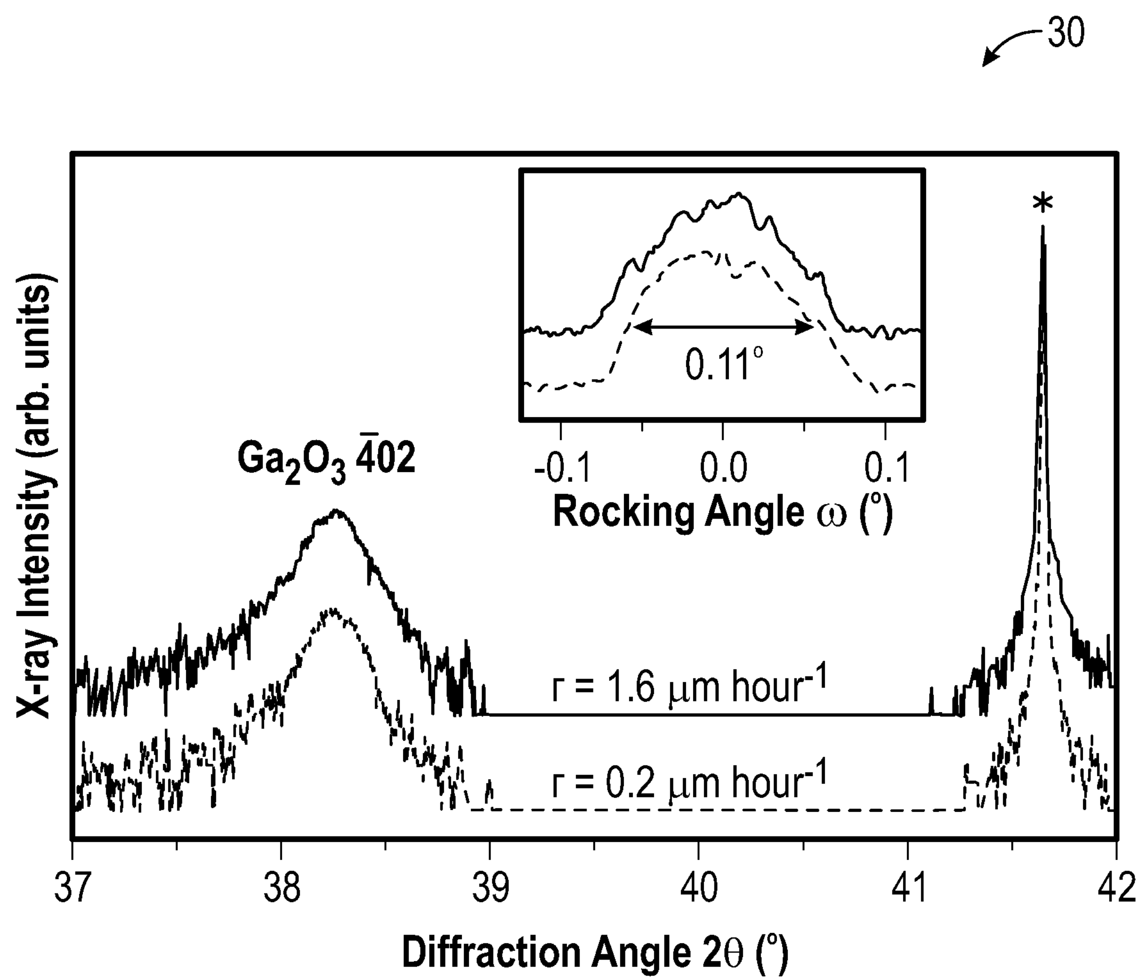
FIG. 7 is a plot that illustrates θ-2θ longitudinal x-ray diffraction (XRD) scans of selected $Ga_2O_3$ films as described for the samples as described for FIG. 6.

The impact of variable growth conditions (i.e., $\Phi_{Ga_2O}$, $\Phi_O$, and $T_G$) on the structural properties and crystallinity of $Ga_2O_3$ (s) grown on $Al_2O_3(0001)$ was investigated. FIG. 7 is a plot 30 that illustrates $\theta$-$2\theta$ longitudinal x-ray diffraction (XRD) scans of selected $Ga_2O_3$ films as described for the same samples as described for FIG. 6. The solid line corresponds to a film grown at $\Phi_{Ga_2O}$=$11.4\times10^{14}$ $Ga_2O$ molecules $cm^{-2}$ $s^{-1}$ and $\Phi_O$ was provided by an oxidant ($O_2$+80% $O_3$) at a background pressure of $5\times10^{-6}$ Torr. The dashed line corresponds to a $Ga_2O_3$ film growth with $\Phi_{Ga_2}O$=$3.0\times10^{14}$ $Ga_2O$ molecules $cm^{-2}$ $s^{-1}$ and $\Phi_O$ was provided by an oxidant ($O_2$+80% $O_3$) at a background pressure of $1\times10^{-6}$ Torr. For both samples, $T_G$ was set at 500° C. The reflections from the $Ga_2O_3$ film are identified to originate from the monoclinic $\beta$-phase, and the transverse scans across the $\bar{4}02$ peak with its full width at half maximum indicated in FIG. 7 have the same value for both films. The 0006 peaks of the $Al_2O_3$ substrates are marked by an asterisk.

The reflections of the films coincide with the β-$Ga_2O_3$ phase grown with their ($\bar{2}$01) plane parallel to the plane of the substrate. The inset portion of the plot 30 represents transverse scans or rocking curves across the symmetric 402 reflection of the same layers. The full width at half maxima in ω of the profiles provides a measure of an out-of-plane mosaic spread of the $Ga_2O_3$ layer. The obtained $\Delta\omega$=0.11° does not change with growth rate and is particularly notable since β-$Ga_2O_3$($\bar{2}$01) films grown on $Al_2O_3$(0001), using monoatomic Ga or compound $Ga_2O_3$ sources, typically show broader line profiles in their out-of-plane crystal distributions (from $\Delta\omega\approx$0.23° to $\Delta\omega\sim$1.00°). Thus, the profiles in FIG. 7 reveal a well-oriented and high quality epitaxial $Ga_2O_3$($\bar{2}$01) thin film. Furthermore, reflection high-energy electron diffraction and XRR measurements reveal a sharp and well-defined interface between $Ga_2O_3$($\bar{2}$01) and $Al_2O_3$ as well as a smooth surface morphology obtained by S-MBE.

Figure 8A:
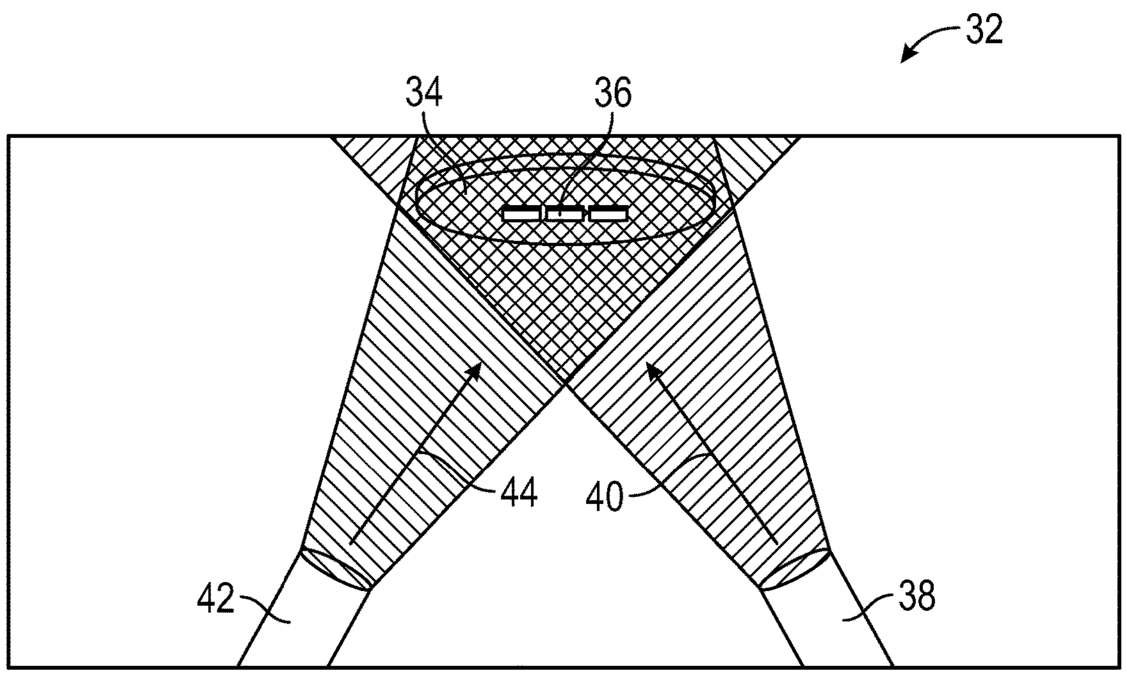
FIG. 8A illustrates an exemplary MBE system that is configured for S-MBE deposition according to principles of the present disclosure.

FIG. 8A illustrates an exemplary MBE system 32 that is configured for S-MBE deposition according to principles of the present disclosure. The MBE system 32 includes a substrate holder 34 that supports one or more substrates 36 in an arrangement for thin film growth. The substrates 36 may comprise sapphire substrates having any available diameter, such as 3 inch, or 6 inch, or 12 inch wafers. For S-MBE growth according to embodiments of the present disclosure, an oxygen source 38 is arranged to provide an active oxygen species 40 or oxidant, such as ozone, or by oxygen plasma-assisted deposition, to the substrates 36 and an effusion cell 42 is arranged to provide a molecular beam of a suboxide 44 to the substrates 36. In this regard, an oxide film formed by S-MBE according to the present disclosure may be represented as $M_xO_y$, where M represents a metal or metalloid. For example, M may include one or more of Al, Ce, Ga, Ge, Hf, In, La, Pr, Si, Sn, Ta, and Zr. The corresponding $M_xO_y$ may include $Al_2O_3$, $Ce_2O_3$ or $CeO_2$, $Ga_2O_3$, $GeO_2$, $HfO_2$, $In_2O_3$, $La_2O_3$, $Pr_2O_3$ or $Pr_6O_{11}$ or $PrO_2$, $SiO_2$, $SnO_2$, $Ta_2O_5$, and $ZrO_2$. For deposition of the $M_xO_y$ film (with $M_2O_3$ for III-VI compounds and $MO_2$ for IV-VI compounds), the suboxide 44 may be represented as $M_zO$ (with $M_2O$ for group-Ill suboxides and MO for group-IV suboxides) and the suboxide 44 may be provided with a flux that allows the $M_xO_y$ film to form by a single-step reaction mechanism within an adsorption-controlled regime where excess amounts of $Mz_O$ are present. The suboxide of $Mz_O$ may be provided by loading a mixture of elemental M and a $M_xO_y$ powder in the effusion cell 42 and subsequently heating, outgassing, and setting it to provide a desired $M_zO$ flux. In certain embodiments, the mixture of M and $M_xO_y$ powder may be configured as $M_xO_y$-rich to promote the desired flux for the suboxide 44. By way of example, for S-MBE deposition where M is Ga and the resulting film is $Ga_2O_3$, a Ga metal and a $Ga_2O_3$ powder may be loaded into the effusion cell 42 to provide a Ga+$Ga_2O_3$ source mixture. The Ga+$Ga_2O_3$ mixture may be configured as a $Ga_2O_3$-rich mixture as provided in the previously described reaction equation (8) and in the Ga—O phase diagram 16 of FIG. 2. In this regard, formation of the resulting film may occur in the adsorption-controlled regime where excess amounts of $Ga_2O$ molecules are present as provided by the $Ga_2O$ flux, thereby allowing higher growth rates with improved crystal quality and reduced amounts of undesired polymorphs.

Figure 8B:
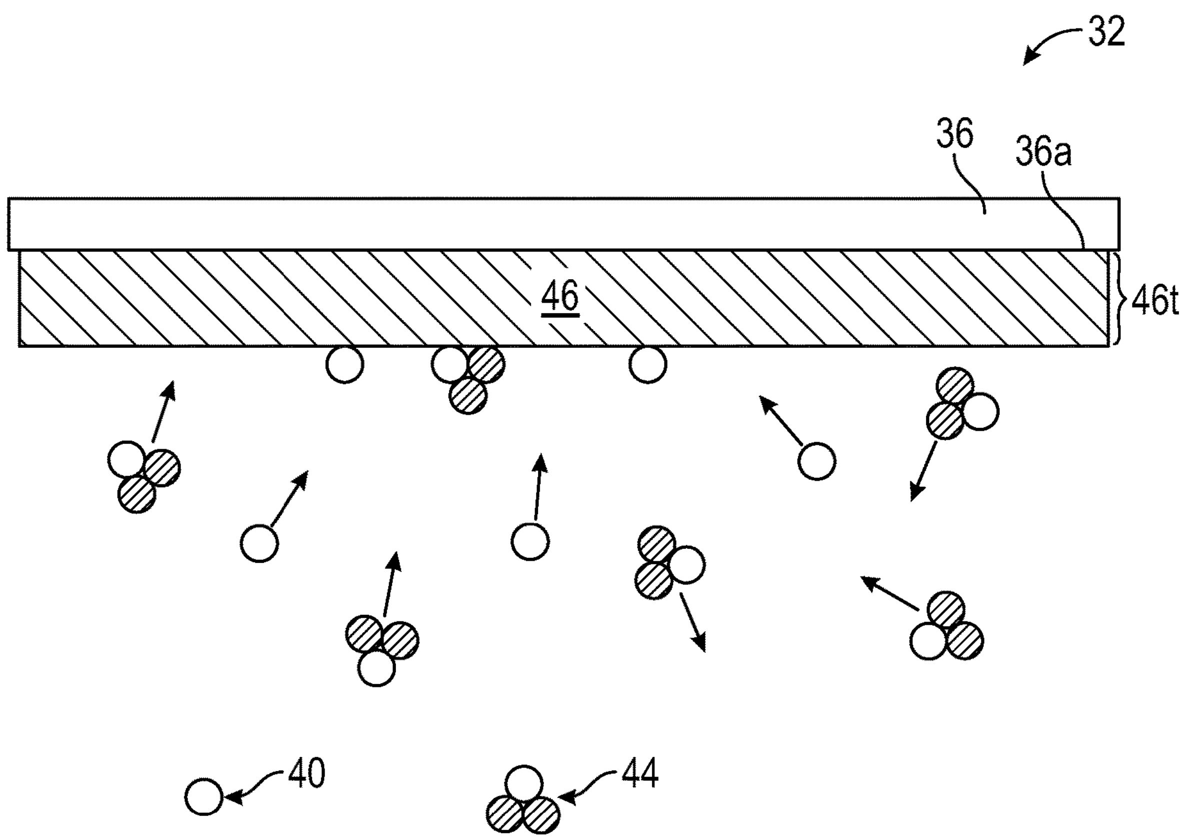
FIG. 8B is a magnified illustration of a portion of the MBE system of FIG. 8A along a growth surface of a substrate according to principles of the present disclosure.

FIG. 8B is a magnified illustration of a portion of the MBE system 32 of FIG. 8A along a growth surface 36a of one of the substrates 36. The active oxygen species 40 and the suboxide 44 are provided to the growth surface 36a of the substrate 36 to form an oxide film 46, which may also be referred to as an oxide layer. When the suboxide 44 is represented as $Mz_O$, the oxide film 46 may be represented as $M_xO_y$. Continuing the example discussed above for FIG. 8A, the oxide film 46 may be $Ga_2O_3$ for embodiments where a Ga+$Ga_2O_3$ source mixture is used to provide the suboxide 44 of $Ga_2O$. By forming the oxide film 46 by a single-step reaction mechanism within an adsorption-controlled regime according to principles of the present disclosure, the oxide film 46 may form with significantly increased growth rates not otherwise possible by conventional MBE techniques. For example, the growth rate of the oxide film 46 (e.g., $Ga_2O_3$) may be at least 0.5 μm/hr, or at least 1 μm/hr, or at least 2 μm/hr, or at least 5 μm/hr, or in a range from 0.5 μm/hr to 5 μm/hr, or in a range from 1 μm/hr to 5 μm/hr depending on the application. For oxygen plasma-assisted S-MBE, the growth rate may exceed 5 μm/hr. The resulting oxide film 46 may thereby form with a thickness 46t as measured in a direction perpendicular to the growth surface 36a that is at least 1 μm, or at least 5 μm, or in a range from 1 μm to 20 μm. Of course, lower thickness 46t values below 1 μm may also be provided according to the S-MBE principles of the present disclosure. Additionally, the oxide film 46 may be grown with high crystal quality over large substrate diameters, such as a single polymorph film of $Ga_2O_3$ grown over a substrate having a diameter of up to 12 inches or more.

As disclosed herein, the growth of high quality $Ga_2O_3$ (s) thin films by S-MBE in the adsorption-controlled regime using Ga (l)+$Ga_2O_3$ (s) source mixtures is provided. The accomplished growth rate of at least 0.5 μm/hr, or at least 1 μm/hr, and improved crystal quality of the obtained $Ga_2O_3$ films on $Al_2O_3$ heterostructures may enable improved mobilities of $Ga_2O_3$ thin films containing n-type donors (Sn, Ge, Si) grown by S-MBE. In certain embodiments, the principles of the present disclosure may also provide mixtures of Sn+$SnO_2$ and/or Ge+$GeO_2$ and/or Si+$SiO_2$ in order to produce SnO (g) and/or GeO (g) and/or SiO (g) molecular beams as n-type donors in such $Ga_2O_3$-based heterostructures. Moreover, $Ga_2O_3$ doped with SnO using $Ga_2O$ and SnO beams may achieve improved control of Sn-doping levels in the $Ga_2O_3$ films.

Based on thermodynamic analysis of the volatility of various binary oxides plus additional two-phase mixtures of metals with their binary oxides, such as Ga+$Ga_2O_3$, the principles of the present disclosure are applicable to additional systems appropriate for growth by S-MBE. By applying this thermodynamic knowledge with the S-MBE growth of $Ga_2O_3$ as described herein, source mixtures of In+$In_2O_3$ and Ta+$Ta_2O_5$ may be provided that allow growth of high quality bixbyite $In_2O_3$ and $In_2O_3$:$SnO_2$ (ITO, with up to 30% Sn) and rutile $TaO_2$ by S-MBE, respectively.

Growing thin films with very high crystalline qualities at high growth rates by using suboxide molecular beams allows S-MBE to be competitive with other established synthesis methods, such as chemical vapor deposition (CVD) or metalorganic vapor phase epitaxy (MOVPE). The growth temperatures as described herein for high quality $Ga_2O_3$ layers grown by S-MBE are significantly lower than what has previously been demonstrated for the growth of $Ga_2O_3$ films by CVD or MOVPE. This makes S-MBE advantageous for BEOL processing. Additionally, $Ga_2O_3$ grown in the adsorption-controlled regime with excess supply of $Ga_2O$ (g) and high oxygen activity in $Ga_2O_3$-rich source mixtures may suppress Ga vacancies in the resulting $Ga_2O_3$ films, which are believed to act as compensating acceptors, thereby improving the electrical performance of n-type $Ga_2O_3$-based devices.

Moreover, the principles of the present disclosure may be applicable to provide $Al+Al_2O_3$ source mixtures for the growth of epitaxial $Al_2O_3$ and $(Al_xGa_{1-x})_2O_3$ at comparably high growth rates by S-MBE. In order to fabricate vertical high-power devices, thin film thicknesses in the μm range are desired. In this manner, S-MBE as described herein allows the epitaxy of such devices in relatively short growth times, such as a few hours. In addition, the use of $Al_2O$ (g) and $Ga_2O$ (g) molecular beams during $(Al_xGa_{1-x})_2O_3$ S-MBE may also extend its growth domain towards higher adsorption-controlled regimes, thereby being advantageous for the performance of $(Al_xGa_{1-x})_2O_3$-based devices.

Additionally, the principles of the present disclosure for S-MBE may be applicable to all materials that form via intermediate reaction products, such as a subcompound. For example, $ZrO_2$, $Pb(Zr,Ti)O_3$, and $(Hf,Zr)O_2$ may be formed by S-MBE that includes supply of a molecular beam of ZrO. In other examples, $Ga_2Se_3$ may be formed with inclusion of a molecular beam of $Ga_2Se$; $In_2Se_3$ may be formed with inclusion of a molecular beam of $In_2Se$; $In_2Te_3$ may be formed with inclusion of a molecular beam of $In_2Te$; and $Sn_2Se$ may be formed with inclusion of a molecular beam of SnSe.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A molecular-beam epitaxy (MBE) method comprising:

providing a molecular beam that comprises a suboxide of an element;

providing an oxidant species; and growing an oxide film of the element by oxidizing the suboxide with the oxidant species, wherein the oxide film is grown with a growth rate in a range from 0.5 microns per hour (μm/hr) to 5 μm/hr.

2. The MBE method of claim 1, wherein the growth rate is in a range from 1 μm/hr to 5 μm/hr.

3. The MBE method of claim 1, wherein the element comprises at least one of aluminum, cerium, gallium, germanium, hafnium, indium, lanthanum, praseodymium, silicon, tin, tantalum, and zirconium.

4. The MBE method of claim 1, wherein the element comprises gallium, the suboxide comprises $Ga_2O$, and the oxide film comprises $Ga_2O_3$.

5. The MBE method of claim 4, wherein a flux ratio in the molecular beam of an amount of the $Ga_2O$ to an amount of the oxidant species is greater than 1.

6. The MBE method of claim 5, wherein the flux ratio is in a range from greater than 1 to 10.

7. The MBE method of claim 4, wherein the molecular beam is produced from a source mixture that includes elemental gallium and an oxide of gallium.

8. The MBE method of claim 7, wherein the source mixture is heated to produce the molecular beam and a purity of the molecular beam is at least 99.5% $Ga_2O$.

9. The MBE method of claim 7, wherein a mole fraction of oxygen in the source mixture is between 0.333 and 0.6.

10. The MBE method of claim 7, wherein providing the molecular beam comprises heating the source mixture to a temperature that is in a range from 907 K to 1594 K.

11. The MBE method of claim 7, wherein providing the molecular beam comprises heating the source mixture to a temperature that is less than or equal to 1500 K.

12. The MBE method of claim 4, wherein a purity of the molecular beam of the $Ga_2O$ is at least 99%.

13. The MBE method of claim 4, further comprising supplying at least one of a molecular beam of SnO, a molecular beam of SiO, and a molecular beam of GeO to provide an n-type dopant for the $Ga_2O_3$.

14. A device comprising:

a substrate; and a layer of gallium oxide on the substrate, wherein the substrate and the gallium oxide form a heterostructure, and wherein the layer of gallium oxide comprises a single polymorph of gallium oxide with a thickness in a range from 1 micron (μm) to 20 μm.

15. The device of claim 14, wherein the thickness is in a range from 1 μm to 5 μm.

16. The device of claim 14, wherein the layer of gallium oxide comprises $Ga_2O_3$.

17. The device of claim 14, wherein the single polymorph comprises monoclinic gallium oxide ($\beta$-$Ga_2O_3$).

18. The device of claim 14, wherein the substrate comprises a diameter in a range from 2 inches to 12 inches.

19. The device of claim 14, wherein the layer of gallium oxide is doped with an n-type impurity that comprises at least one of tin, germanium, and silicon.

20. The device of claim 14, wherein a concentration of gallium vacancy defects in the layer of gallium oxide is in a range from $1\times10^{14}$ $cm^{-3}$ to $1\times10^{17}$ cm 3.

* * * * *